United States Patent
Jung et al.

(10) Patent No.: US 7,554,617 B2
(45) Date of Patent: Jun. 30, 2009

(54) LIQUID CRYSTAL DISPLAY WITH WIDE VIEWING ANGLE WITH OVERLAPPING COUPLING ELECTRODES FORMING CAPACITOR INTERCONNECTING SUB-PIXEL ELECTRODES

(75) Inventors: Mee-Hye Jung, Hwaseong-si (KR); Nak-Cho Choi, Seoul (KR); Doo-Hwan You, Suwon-si (KR); Jae-Jin Lyu, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 232 days.

(21) Appl. No.: 11/145,303

(22) Filed: Jun. 3, 2005

(65) Prior Publication Data

US 2005/0280749 A1    Dec. 22, 2005

(30) Foreign Application Priority Data

Jun. 3, 2004    (KR) .................... 10-2004-0040383

(51) Int. Cl.
*G02F 1/1343* (2006.01)
(52) U.S. Cl. ........................................ 349/38; 349/144
(58) Field of Classification Search .................. 349/38, 349/39, 106–109, 144
See application file for complete search history.

(56) References Cited

U.S. PATENT DOCUMENTS 5,576,863 A    11/1996  Aoki et al.

(Continued)

FOREIGN PATENT DOCUMENTS

CN    1383214    12/2002

(Continued)

OTHER PUBLICATIONS

Patent Abstracts of Japan, No. 06-102537, Apr. 15, 1994, 1 page.

(Continued)

*Primary Examiner*—David Nelms
*Assistant Examiner*—John Heyman
(74) *Attorney, Agent, or Firm*—Haynes and Boone LLP

(57) ABSTRACT

In accordance with another embodiment of the present invention, a LCD panel includes an active matrix substrate, a patterned substrate disposed opposite to the active matrix substrate, and a liquid crystal layer interposed between the active matrix substrate and the patterned substrate. The active matrix substrate includes a transistor, a pixel electrode having a first sub-pixel electrode and a second sub-pixel electrode, a first electrode connected to the second sub-pixel electrode, and a second electrode connected to the source electrode of the transistor and the first sub-pixel electrode. The second electrode is coupled to the first electrode so as to form a capacitor. The active matrix substrate can include a protective insulating layer between the second electrode and the pixel electrode, and the protective insulating layer can include a color filter layer. The semiconductor layer of the transistor can extends such that a portion of the semiconductor layer has the same boundary as the second electrode. The patterned substrate has an aperture that divides the liquid crystal layer into a plurality of domains. The first and second electrodes are formed along a portion of the aperture of the patterned substrate.

21 Claims, 11 Drawing Sheets

U.S. PATENT DOCUMENTS

| | | | |
|---|---|---|---|
| 5,610,739 A * | 3/1997 | Uno et al. | 349/39 |
| 5,646,702 A * | 7/1997 | Akinwande et al. | 349/69 |
| 6,191,835 B1 * | 2/2001 | Choi | 349/106 |
| 6,255,130 B1 * | 7/2001 | Kim | 438/30 |
| 6,661,488 B1 * | 12/2003 | Takeda et al. | 349/117 |
| 6,822,703 B2 * | 11/2004 | Hwang et al. | 349/43 |
| 2002/0109813 A1 * | 8/2002 | Yu et al. | 349/141 |
| 2003/0095223 A1 | 5/2003 | Song | |
| 2004/0070713 A1 | 4/2004 | Song | |
| 2004/0085272 A1 | 5/2004 | Ting et al. | |

FOREIGN PATENT DOCUMENTS

| | | |
|---|---|---|
| EP | 0685756 A2 | 5/1995 |
| EP | 0685756 A3 | 5/1995 |
| JP | 06-102537 | 4/1994 |

OTHER PUBLICATIONS

European Search Report, 2 pages.

English Abstract, Publication No. CN1383214, Dec. 4, 2002.

* cited by examiner

LIQUID CRYSTAL DISPLAY WITH WIDE VIEWING ANGLE WITH OVERLAPPING COUPLING ELECTRODES FORMING CAPACITOR INTERCONNECTING SUB-PIXEL ELECTRODES

BACKGROUND

1. Technical Field

The present invention relates to a liquid crystal display, and more particularly to an LCD having a wide viewing angle.

2. Description of the Related Art

A liquid crystal display (LCD), which is one of the most widely used flat panel displays, typically includes two substrates having field-generating electrodes thereon and a liquid crystal (LC) layer interposed between the two substrates. To produce an image on the LCD, voltage signals are applied to the field-generating electrodes of the substrates to generate an electric field across the LC layer and thus control the orientation of LC molecules of the LC layer. The controlled orientation of the LC molecules creates an image by adjusting the polarization of incident light.

In comparison with conventional cathode ray tube (CRT) displays, an LCD has a narrower viewing angle. A number of techniques have been proposed to overcome this drawback, one of the techniques being known as Vertically Aligned (VA) mode LCD. In the VA mode LCD, the liquid crystals are vertically aligned to the substrate surface plane at the off-state where no voltage or off-voltage is applied, so that the incident light leakage through the LCD is almost zero in the black state (off state with Cross-Nicole state). Due to this minimized light leakage, the Contrast Ratio (CR) of the VA mode LCD, which represents the ratio of white state luminance to black state luminance, is higher than that of any other mode LCDs, such as Twisted-Nematic (TN) mode LCD and In-Plane-Switching (IPS) mode LCD, which employs another enhanced viewing angle technique.

As described above, the VA mode LCD provides an improved viewing angle from the standpoint of Contrast Ratio. However, in the VA mode LCD, like other mode LCDs, the color patterns viewed from the vertical direction to the LCD and from the slanted direction are recognized somewhat differently. This phenomenon ("Color Shift") comes from the fact that the light path changes depending on the viewing angle. Accordingly, the voltage-transmittance curve (the V-T curve) or the gamma curve also change relative to the viewing angle.

SUMMARY

The present invention is directed to the structure of an LCD panel that can produce an improved visual image.

In accordance with an embodiment of the present invention, an active matrix substrate of the LCD panel includes a transistor, a pixel electrode having a first sub-pixel electrode and a second sub-pixel electrode, a first electrode connected to the second sub-pixel electrode, and a second electrode connected to the source electrode of the transistor and the first sub-pixel electrode. The second electrode is coupled to the first electrode so as to form a capacitor. The active matrix substrate can include a protective insulating layer between the second electrode and the pixel electrode, and the protective insulating layer can include a color filter layer. The semiconductor layer of the transistor can extend such that a portion of the semiconductor layer has the same boundary as the second electrode.

In accordance with another embodiment of the present invention, a LCD panel includes an active matrix substrate, a patterned substrate disposed opposite to the active matrix substrate, and a liquid crystal layer interposed between the active matrix substrate and the patterned substrate. The active matrix substrate includes a transistor, a pixel electrode having a first sub-pixel electrode and a second sub-pixel electrode, a first electrode connected to the second sub-pixel electrode, and a second electrode connected to the source electrode of the transistor and the first sub-pixel electrode. The second electrode is coupled to the first electrode so as to form a capacitor. The patterned substrate has an aperture that divides the liquid crystal layer into a plurality of domains. The first and second electrodes are formed along a portion of the aperture of the patterned substrate.

In accordance with another embodiment of the present invention, a method is provided for operating a liquid crystal display comprising a first substrate, a second substrate, and a liquid crystal layer interposed between the first and second substrates. The method comprises: applying a data voltage signal via a data line to a pixel electrode, the pixel electrode comprising a first sub-pixel electrode and a second sub-pixel electrode; applying the data voltage signal to the first sub-pixel electrode; reducing the data voltage signal to a reduced data voltage signal; and applying the reduced data voltage signal to the second sub-pixel electrode.

BRIEF DESCRIPTION OF THE DRAWINGS

Use of the same reference symbols in different figures indicates similar or identical items.

DETAILED DESCRIPTION OF THE PREFERRED EMBODIMENTS

Figure 1:
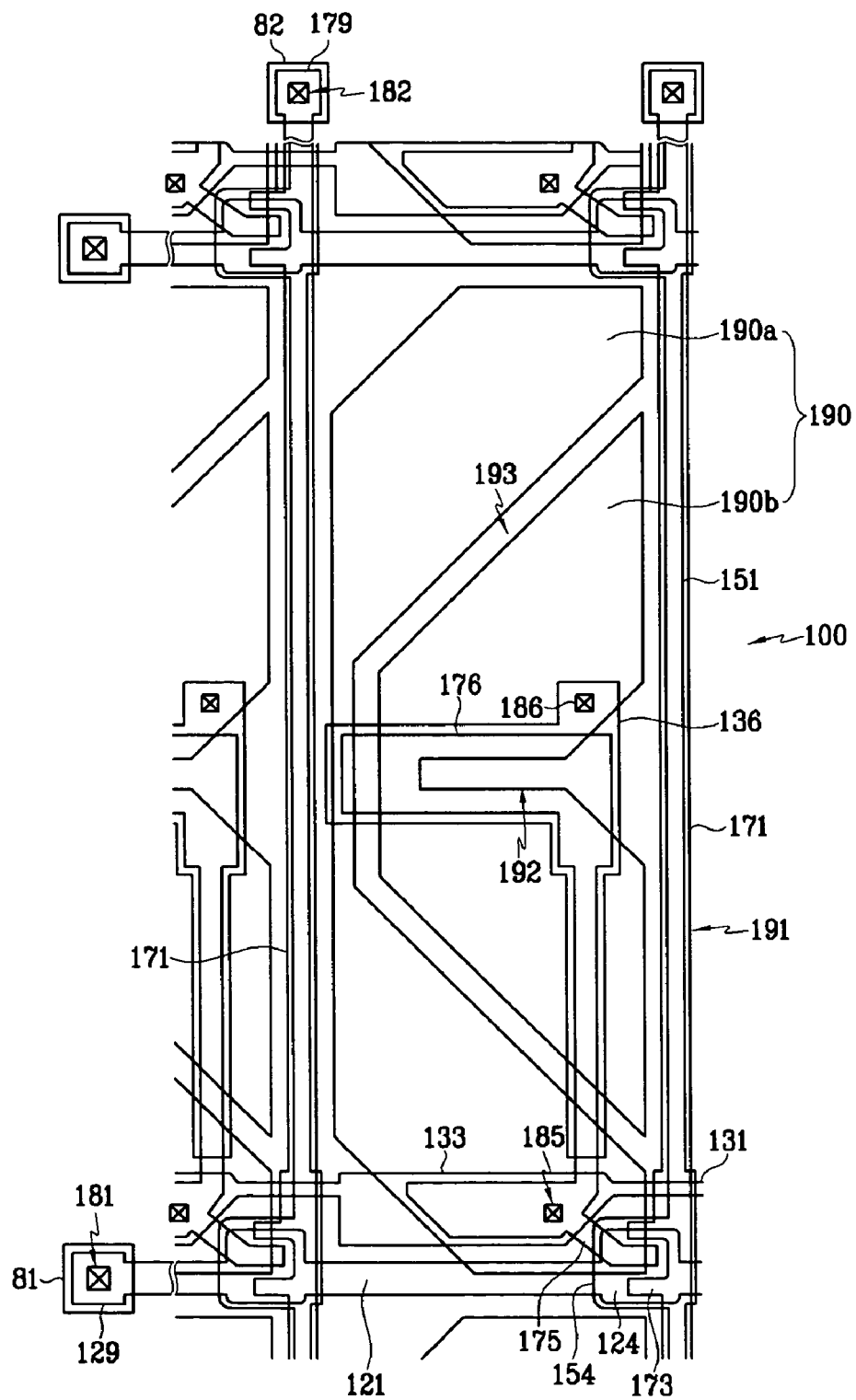
FIG. 1 shows a layout of an active matrix TFT (Thin-Film-Transistor) substrate according to an embodiment of the invention.
Figure 2:
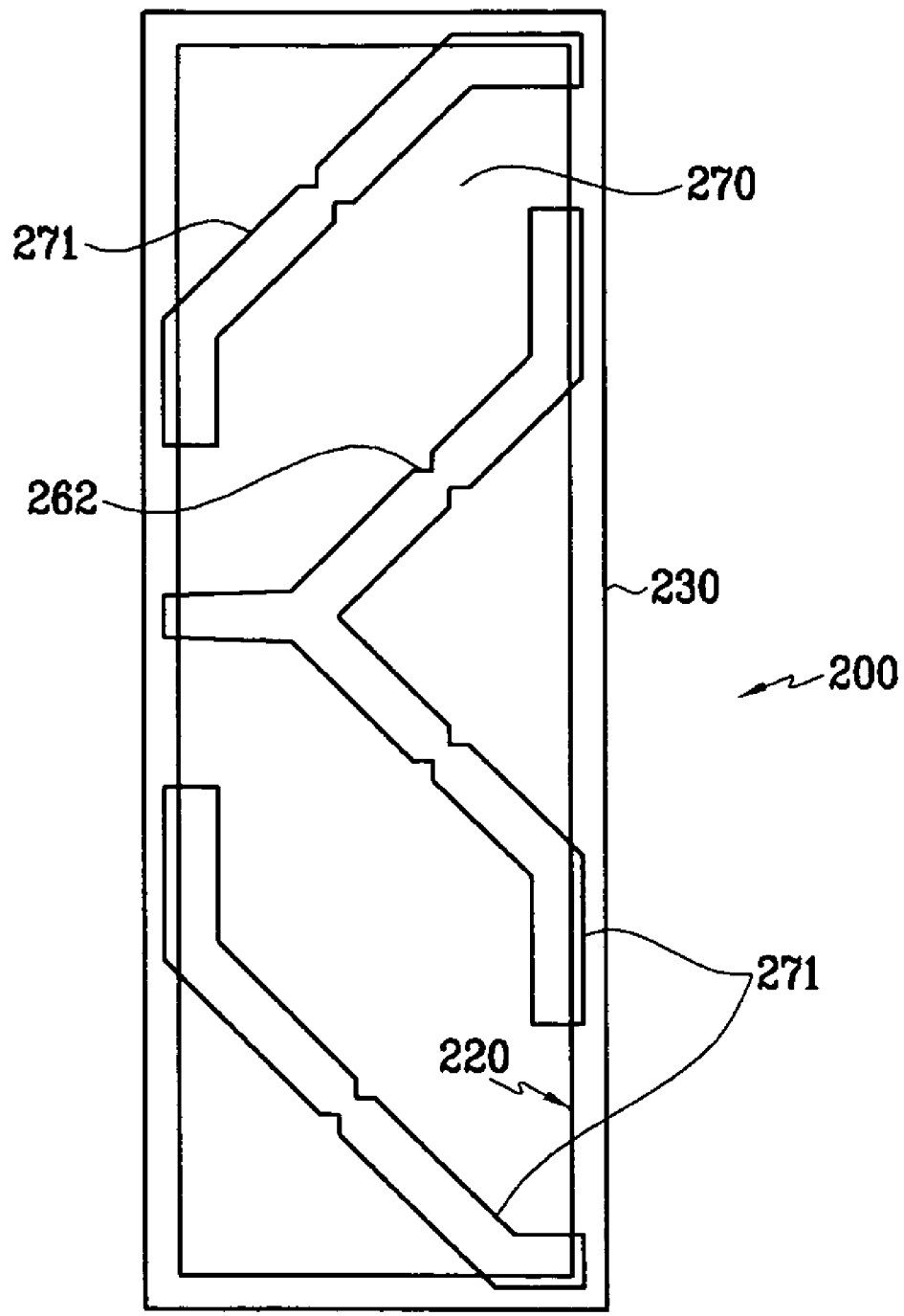
FIG. 2 shows a layout of a patterned substrate matched to the active matrix TFT substrate of FIG. 1.
Figure 3:
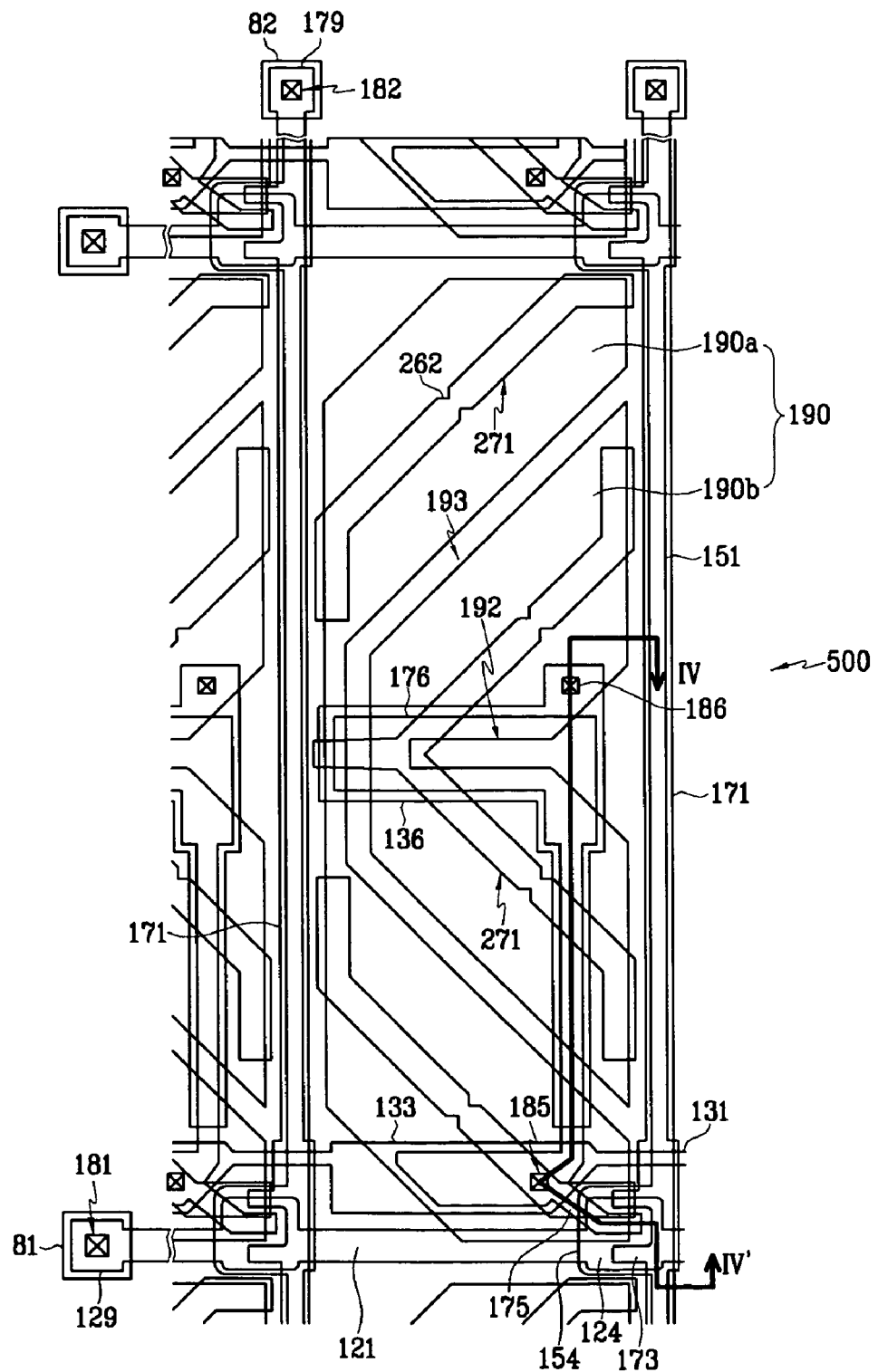
FIG. 3 shows a layout of a liquid crystal display (LCD) panel, in which the active matrix TFT substrate of FIG. 1 and the patterned substrate of FIG. 2 are overlapped.
Figure 4:
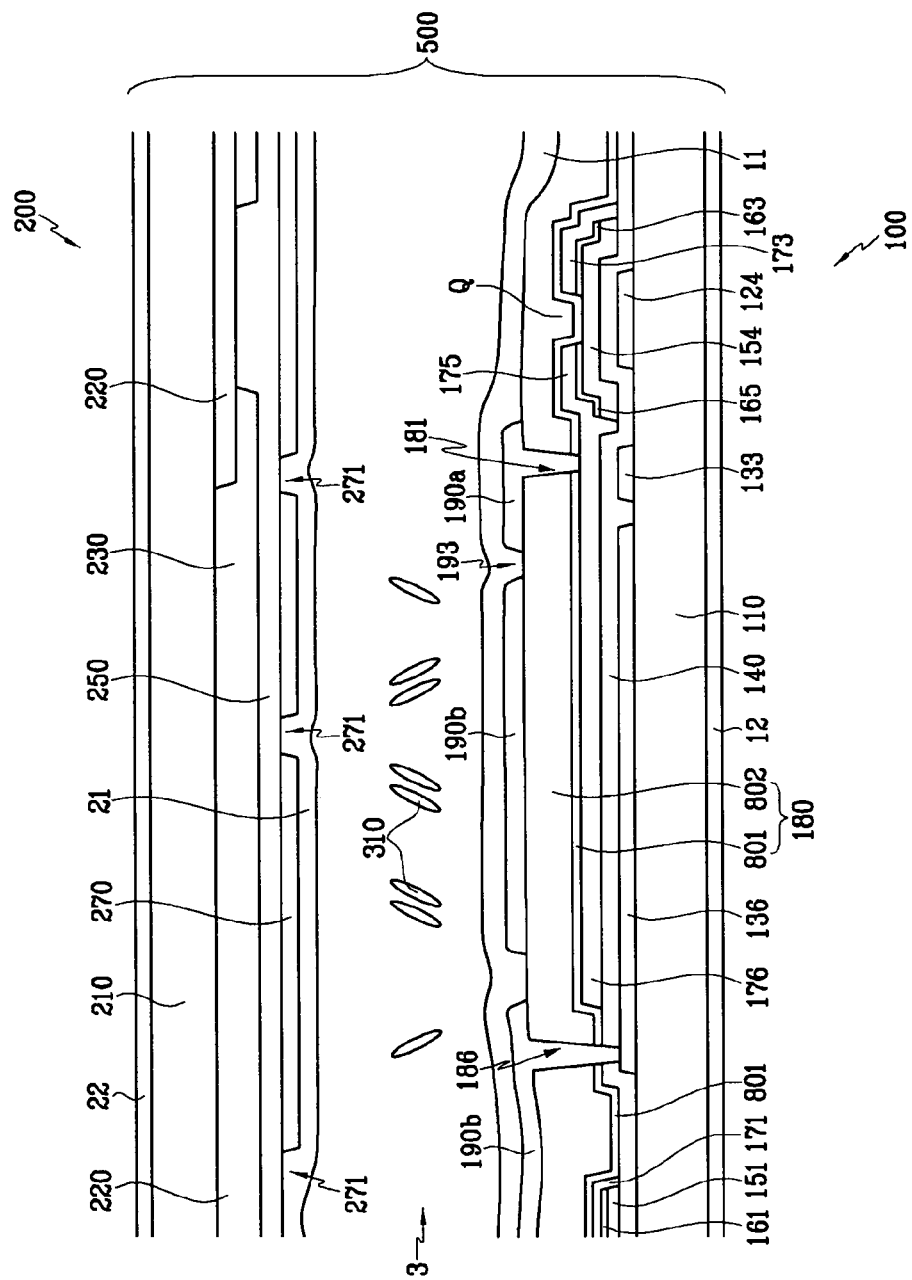
FIG. 4 is a cross-sectional view of FIG. 3 along the line IV-IV'.

FIGS. 1 to 4 illustrate portions of an LCD panel 500 in accordance with an embodiment of the invention. FIG. 3 shows the layout of LCD panel 500. FIG. 1 shows the layout of an active matrix TFT substrate 100 for LCD panel 500, and FIG. 2 shows the layout of a patterned substrate 200 matched to active matrix TFT substrate 100 of FIG. 1. FIG. 4 is the cross sectional view of FIG. 3 along the line IV-IV'.

Referring to FIG. 4, LCD panel 500 comprises an active matrix TFT substrate 100, a patterned substrate 200, and liquid crystals 310 interposed between substrates 100 and 200. Aligning layers 11 and 21 of substrates 100 and 200, respectively, face each other such that liquid crystals 310 can be vertically aligned to substrates 100 and 200. In addition, polarizers 12 and 22 are provided on LCD panel 500 as shown in FIG. 4.

Figure 5:
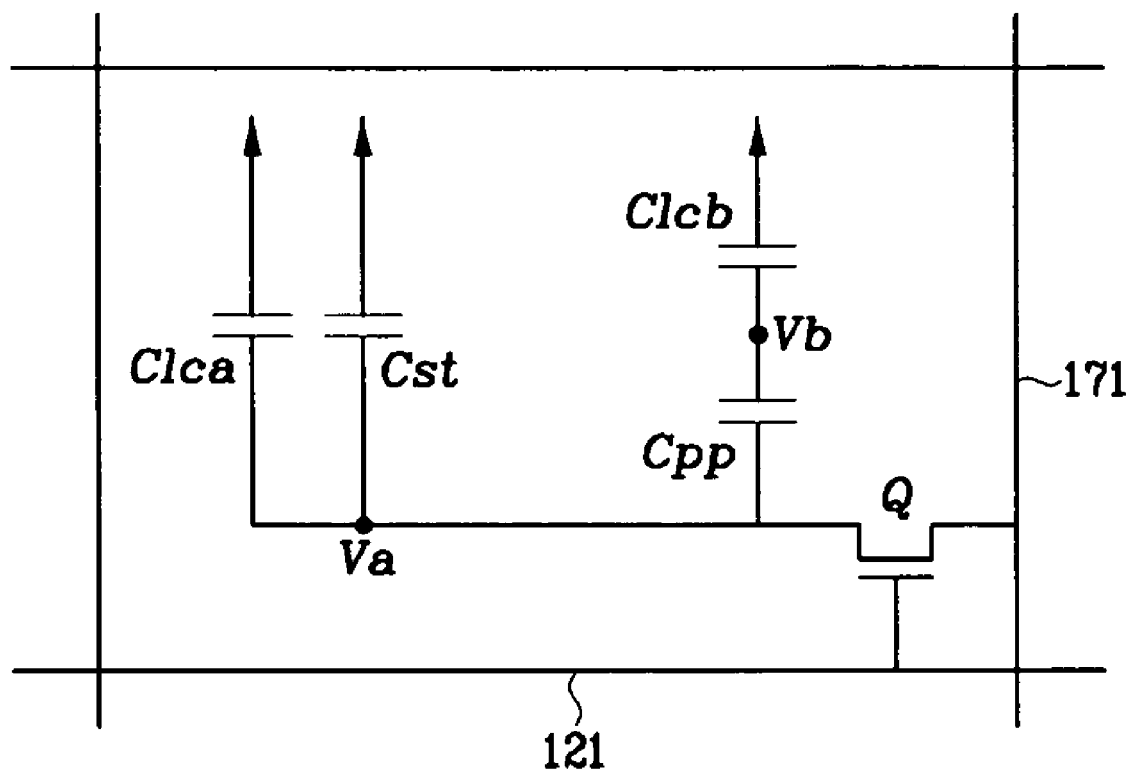
FIG. 5 is a circuit diagram of the LCD panel of FIG. 3.

Referring to FIGS. 1, 4, and 5, active matrix TFT substrate 100 comprises a number of pixels 191. Each pixel 191 includes a pixel electrode 190, which is divided into sub-pixel electrodes 190a and 190b. Between sub-pixel electrodes 190a and 190b is an aperture 193.

In the operation of LCD panel 500 in accordance with an embodiment of the present invention, when a data voltage signal Va is applied from a data line 171, data voltage signal Va is applied to sub-pixel electrode 190a through a switching transistor Q, shown in FIG. 5. On the other hand, while voltage level Va is applied to sub-pixel electrode 190a, a voltage level Vb reduced by a coupling capacitor Cpp is applied to sub-pixel electrode 190b that is connected to an auxiliary coupling electrode 136 through a contact hole 186. Sub-pixel electrode 190a is connected to a coupling electrode 176 through a contact hole 185.

Consequently, when data voltage signal Va is applied to pixel 191 through switching transistor Q, two different voltage levels are respectively applied to sub-pixel electrodes 190a and 190b. Thus, pixel 191 comes to have two sub-pixel areas having different light transmittance from each other (sometimes referred to as the gamma curve mixing effect), so that the color shift in wide viewing angle dramatically reduces. In other words, the gamma curve (gray-luminance curve) formed by merging the gamma curve of a lower voltage area and the gamma curve of a higher voltage area is less distorted than the gamma curve of a single average voltage area, when viewed at an angle. The off-axis image quality can be improved by providing sub-pixels having slightly different LC molecule tilt angles produced by the sub-pixel voltage level differential.

According to an embodiment of the present invention, a coupling capacitor Cpp (shown in FIG. 5) is formed by auxiliary coupling electrode 136, coupling electrode 176, and a gate insulator 140 (shown in FIG. 4).

Referring to FIGS. 1, 3 and 4, the structure of active matrix substrate 100 is explained in detail. Active matrix TFT substrate 100 includes a number of gate lines 121 on a substrate 110, which deliver scanning (or gate) signals. Each gate line 121 extends to a gate electrode 124 of switching transistor Q. According to this embodiment, at the end of gate lines 121, gate pads 129 are formed to connect gate lines 121 to an external driving circuit. The external driving circuit can be formed on a separate chip or on active matrix TFT substrate 100. When the driving circuit is integrated on active matrix TFT substrate 100, gate pads 129 may be omitted. On the same layer as gate line 121, a storage electrode 133 is formed so as to form a storage capacitor Cst. Storage capacitor 133 connects to an adjacent storage capacitor through a storage line 131. Auxiliary coupling electrode 136 is also on the same layer as gate line 121. Sputtering processes can be used to form gate lines 121, storage lines 131, and auxiliary coupling electrode 136 so as to have a single-layer structure or a multi-layer structure comprising Al (or Al alloy), Mo (or Mo alloy), Cr (or Cr alloy), Ti(or Ti alloy), Ta(or Ta alloy), Ag (or Ag alloy), or Cu (or Cu alloy).

For example, gate lines 121, storage lines 131, and auxiliary coupling electrode 136 can have the structure of two layers including a lower layer composed of Al—Nd alloy and an upper layer composed of Mo.

Gate insulator 140 comprising silicon nitride is formed over gate lines 121, storage lines 131, and auxiliary coupling electrode 136 by chemical vapor deposition (CVD). An exemplary thickness of gate insulator 140 is 1000-5000 Å. Gate insulator 140 is thinner than protective layer 180, which will be discussed later.

The capacitance of coupling capacitor Cpp is inversely proportional to the thickness of gate insulator 140, and is proportional to the overlapping area between auxiliary coupling electrode 136 and coupling electrode 176. Accordingly, since the thickness of gate insulator 140 is relatively small, it is possible to obtain a sufficient coupling capacitance with a relatively small overlapping area between auxiliary coupling electrode 136 and coupling electrode 176. The reduced overlapping area improves the transmittance of LCD panel 500.

A semiconductor layer, such as an amorphous silicon (a-Si) layer is formed by CVD over gate insulator 140. The a-Si layer, by patterning, forms a channel area 154 in switching transistor Q and a semiconductor layer 151 under data line 171.

An a-Si layer highly doped with n-type impurity is formed by CVD and is patterned so as to form a source ohmic contact layer 163 and a drain ohmic contact layer 165. The patterning of the a-Si layer highly doped with n-type impurity also produces a buffer layer 161 between semiconductor layer 151 and data line 171. In general, the a-Si layer for channel area 154 and semiconductor layer 151 and the a-Si layer highly doped with n-type impurity for ohmic contact layers 163,165 may be sequentially formed by CVD and are simultaneously patterned.

Over gate insulator 140, semiconductor layer 151, channel area 154, and ohmic contact layers 163 and 165 are formed data line 171, a drain electrode 175, and a source electrode 173 of switching transistor Q. Source electrode 173 extends from data line 171 so that data signals are supplied to source electrode 173 through data line 171. At an end portion of data line 171, data pad 179 is formed to connect data line 171 to an external data driving circuit. Alternatively, the data driving circuit can be integrated on active matrix TFT substrate 100 and directly connected to data line 171.

Coupling electrode 176 which extends from drain electrode 175 is formed when data line 171 is formed. Data line 171, drain electrode 175, and coupling electrode 176 may be formed by sputtering and patterning of a metal layer comprising, e.g., Al (Al alloy), Mo (Mo alloy), Cr (Cr alloy), Ti (Ti alloy), Ta (Ta alloy), Ag (Ag alloy), or Cu(Cu alloy). Data line 171, drain electrode 175, and coupling electrode 176 can have a single layer structure or a multi-layer structure. An exemplary three-layer structure of data line 171, drain electrode 175, and coupling electrode 176 can have an Al middle layer and upper and lower layers composed of Mo nitride or Mo—Nb alloy.

A protective layer 180 comprising a first protective layer 801 and a second protective layer 802 is formed over active matrix TFT substrate 100 after the formation of the data line 171, drain electrode 175, and coupling electrode 176.

First protective layer 801 is formed of silicon nitride with a thickness of 1000-5000 Å by CVD. Second protective layer 802 is formed of an organic material with thickness of 1.0-5.0 µm by a slit or spin coating method.

Second protective layer 802 has a relatively low dielectric constant, which can be 1.0-5.0, and has a large thickness, which can be above 1.0 µm (preferably 1.0-5.0 µm). Accordingly, because the capacitance between pixel electrode 190 and data line 171 is minimized, the area of pixel electrode 190 can be increased. The increase of the area of pixel electrode 190 increases the transmittance of LCD panel 500. In other embodiments, first protective layer 801 can be omitted. In accordance with another embodiment of the present invention, second protective layer 802 can include a color filter layer. In this case, a color filter layer 230 of patterned substrate 200 is removed.

Protective layer 180 includes contact holes 182 and 185, which expose an end of data line 171 and a portion of drain electrode 175, respectively. Protective layer 180 also includes contact holes 181 and 186, which expose an end of gate line 121 and a portion of auxiliary coupling electrode 136, respectively. Contact holes 181 and 186 extend through gate insulator 140.

Over protective layer 180, pixel electrode 190 including a number of sub-pixels electrodes 190a and 190b and redundant pads 81 and 82 is formed by sputtering of a transparent conductive material such as indium tin oxide (ITO) or indium zinc oxide (IZO).

Pixel electrode 190 is divided into sub-pixel electrodes 190a and 190b by aperture 193. Sub-pixel electrode 190a connects through contact hole 185 to drain electrode 175 of switching transistor Q. Sub-pixel electrode 190b connects to auxiliary coupling electrode 136 through contact hole 186, and auxiliary coupling electrode 136 is coupled to coupling electrode 176 to form a capacitor.

In LCD panel 500, voltage level Vb reduced by coupling capacitor Cpp is applied to the sub-pixel electrode 190b while data voltage level Va is applied to sub-pixel electrode 190a.

Connecting pads 81 and 82, which are often made of ITO or IZO, are formed to connect gate pad 129 and data pad 179, respectively, to external driving circuits. Contact holes 181 and 182 connect pads 81 and 82 to gate pad 129 and data pad 179, respectively. In case that the external driving circuits are formed on active matrix TFT substrate 100, the external driving circuits may directly connect to gate and data lines 121 and 171. Pads 81, 82, 129, and 179 and contact holes 181 and 182 are omitted.

Over pixel electrode 190, aligning layer 11 for aligning liquid crystal molecules 310 in the direction perpendicular to active matrix TFT substrate 100 is formed of a polymeric material such as polyimide.

Referring to FIGS. 2, 3 and 4, the structure of patterned substrate 200 will be explained. A black matrix 220 is formed on a base substrate 210 so as to prevent light leakage caused by the electric field interference by date line 171 or gate line 121.

A color filter layer 230, which includes red, green, and blue elements, is formed on black matrix 220 and substrate 210 so as to express various combinations of colors.

An overcoat layer 250 is formed over color filter layer 230 so that the surface of overcoat layer 250 is substantially flat. Then, a common electrode 270, which is made of a transparent conductive material such as ITO or IZO, is formed by sputtering on overcoat layer 250. Common electrode 270 includes a number of apertures 271.

The arrangement of apertures 193 and 271 are designed so as to control the liquid crystal domain by directing liquid crystals 310 into pre-determined orientations. The average orientation of liquid crystals is preferably at a 450 angle relative to the polarizing axes of the polarizing films of the LCD display. Generally, the polarizing axes of polarizing films are parallel or perpendicular to the data line and the average orientation of liquid crystals is perpendicular to that of the aperture. Accordingly, the apertures may be formed to be diagonally oriented. Depending on the layout of apertures 193 and 271, the liquid crystal texture can be reduced, and light-transmittance can be improved. For example, notches 262 of aperture 271 can provide more precise control of liquid crystals 310 in a certain region.

In another embodiment according to the present invention, alternative means such as protrusions can be used for the domain control. These protrusions are generally formed on the pixel electrode and/or the common electrode and are made of an organic material. It is also possible to mix protrusions and apertures as domain controlling means. For example, the apertures are formed on the active matrix TFT substrate 100 and the protrusions are formed on patterned substrate 200, or the protrusions are formed on active matrix TFT substrate 100 and the apertures are formed on patterned substrate 200.

After being fabricated as described above, active matrix TFT substrate 100 and patterned substrate 200 are assembled with each other, and liquid crystals 310 are interposed between active matrix TFT substrate 100 and patterned substrate 200.

Figure 6:
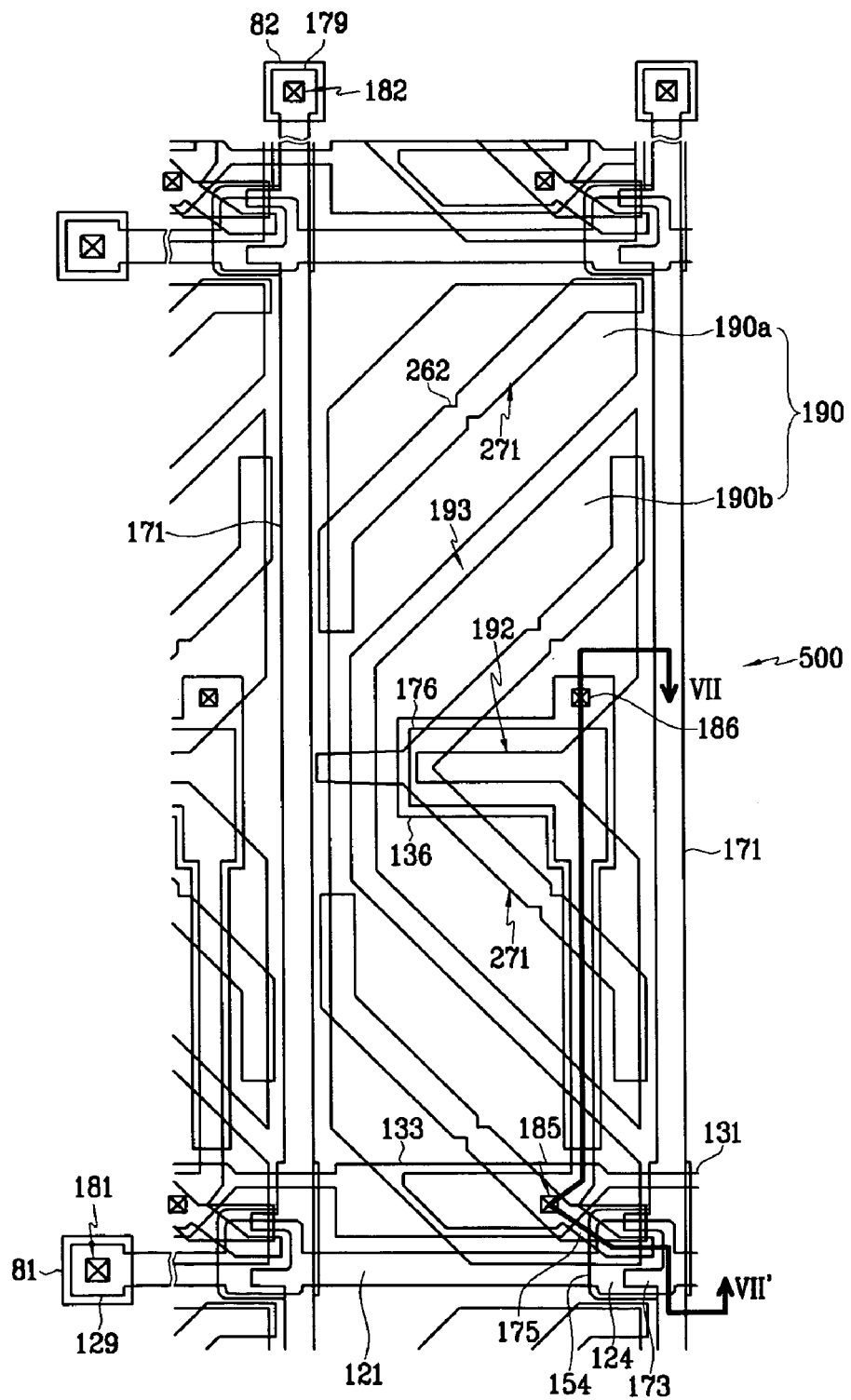
FIG. 6 shows a layout of a liquid crystal panel according to another embodiment of the invention.
Figure 7:
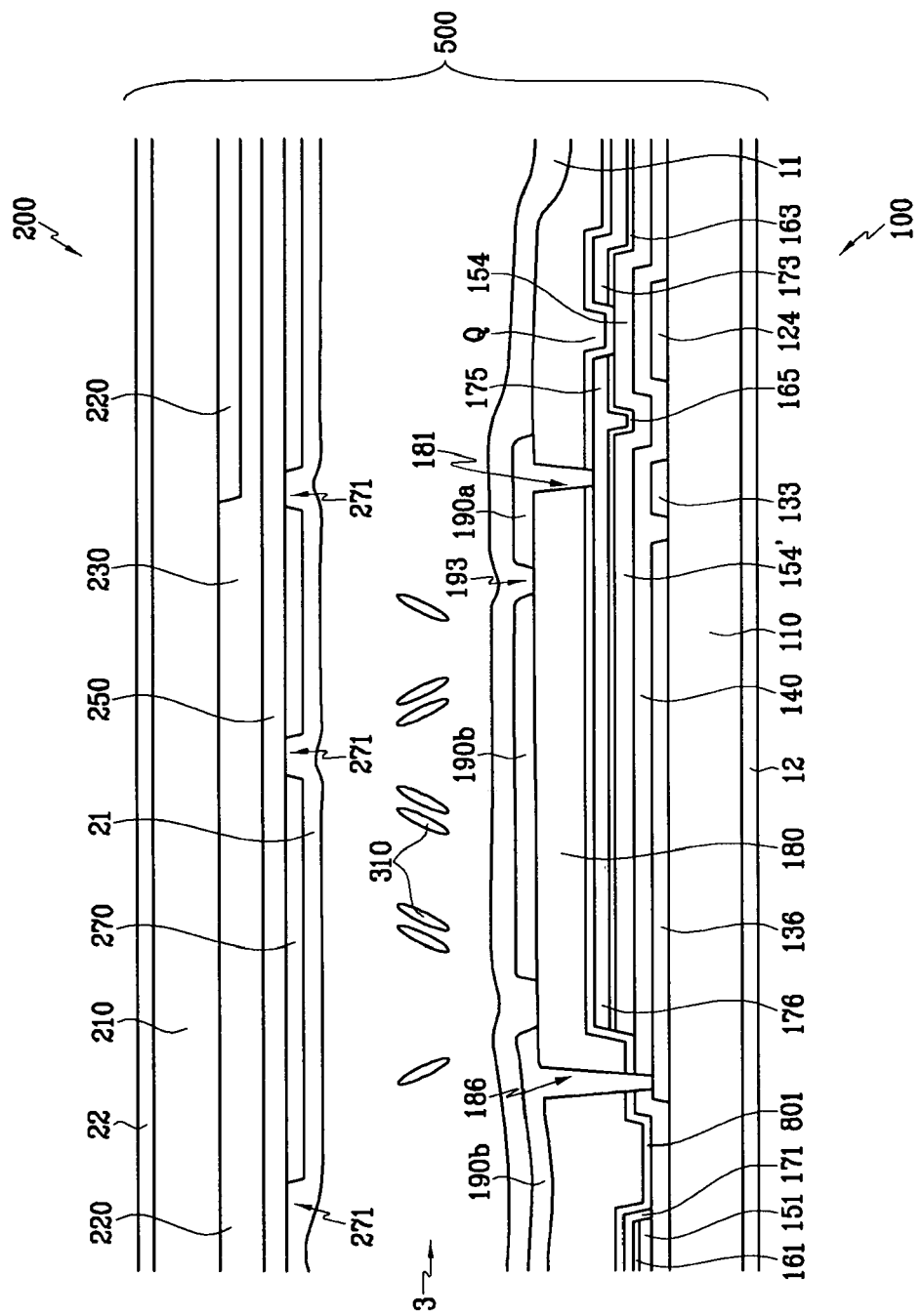
FIG. 7 is a cross-sectional view of FIG. 6 along the line VII-VII'.

FIGS. 6 and 7 illustrate LCD panel 500 in accordance with another embodiment of the present invention. FIG. 6 is the layout of LCD panel 500, and FIG. 7 is the cross sectional view of LCD panel 500 along the line VII-VII' of FIG. 6.

LCD panel 500 of FIGS. 6 and 7 is basically the same as LCD panel 500 of FIGS. 3 and 4, except with respect to the layout of the semiconductor channel area and ohmic contact layer of the switching transistor Q. Accordingly, detailed explanation on the common structure will be omitted.

Referring to FIG. 7, semiconductor channel area 154, a semiconductor layer 154' extending from semiconductor channel area 154, and semiconductor layer 151 have substantially the same boundary as data line 171, source electrode 173, drain electrode 175, and coupling electrode 176. This same boundary profile results in when the a-Si layer for semiconductor channel area 154 and semiconductor layers 151 and 154' and the metal layer for data line 171, source electrode 173, drain electrode 175, and coupling electrode 176 are simultaneously patterned.

The simultaneous patterning, after the deposition of an a-Si layer, an a-Si layer highly doped with n-type impurity, and a metal layer, uses a slit-mask photo resist pattern. In the slit-mask photo resist pattern, a slit with a half-tone exposure is formed at a region corresponding to channel area 154 so as to control the depth of patterning. This simultaneous patterning of FIG. 7, in comparison to the two-step patterning of FIG. 4, reduces fabrication cost and time.

Figure 8:
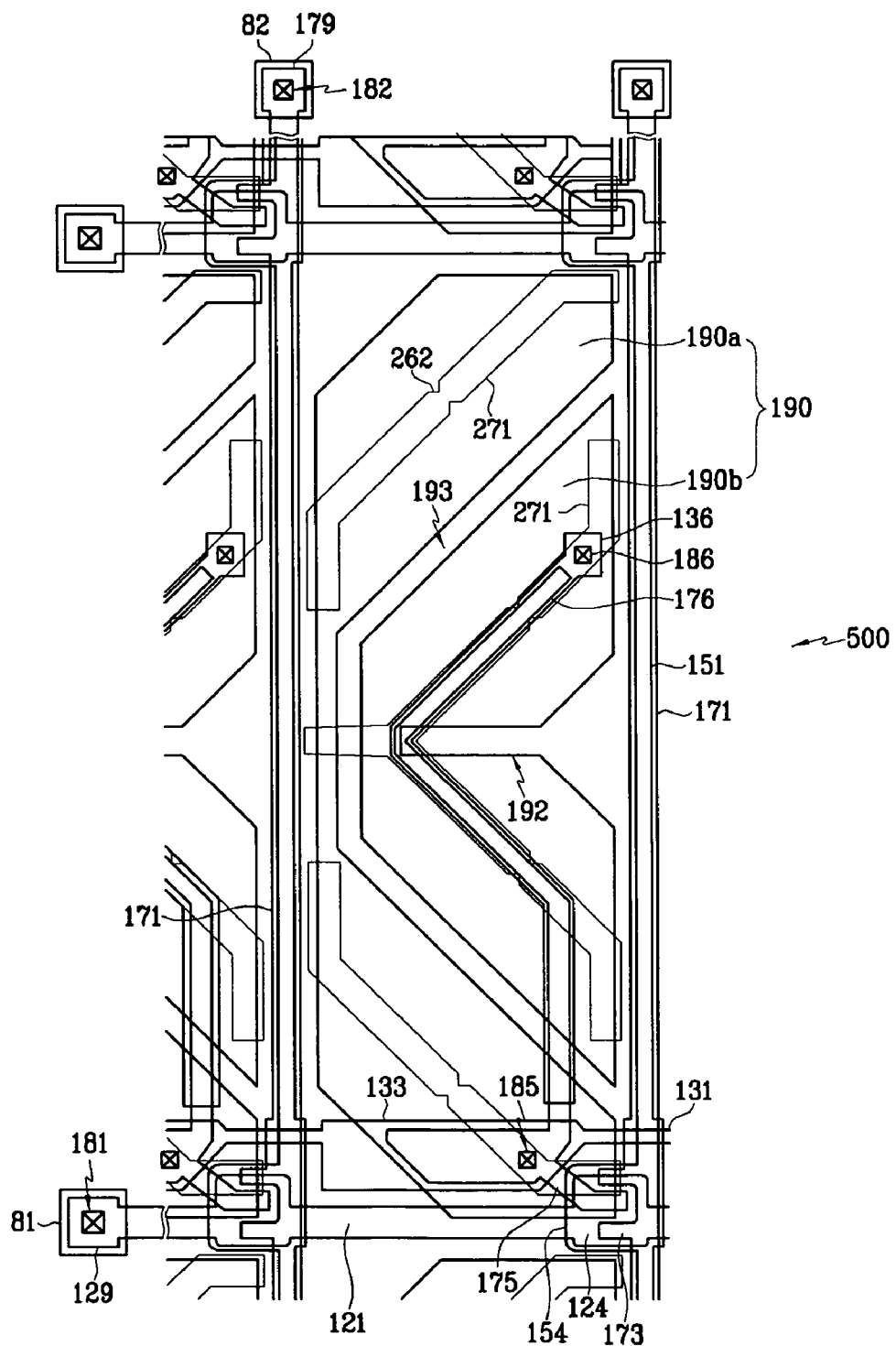
FIG. 8 shows a layout of an LCD panel according to another embodiment of the invention.

FIG. 8 is a layout of an LCD panel 500 according to another embodiment of the invention. LCD panel 500 of FIG. 8 is basically the same as LCD panel 500 of FIGS. 3 and 4, except with respect to the layout of coupling electrode 176 and auxiliary coupling electrode 136. Therefore, detailed explanation on the common structure will be omitted.

Referring to FIG. 8, coupling electrode 176 and auxiliary coupling electrode 136 are formed along a portion of apertures 271 of common electrode 270 of FIG. 2, so that light leakage through aperture 271 is reduced. Accordingly, light transmittance of LCD panel 500 can be increased.

Figure 9:
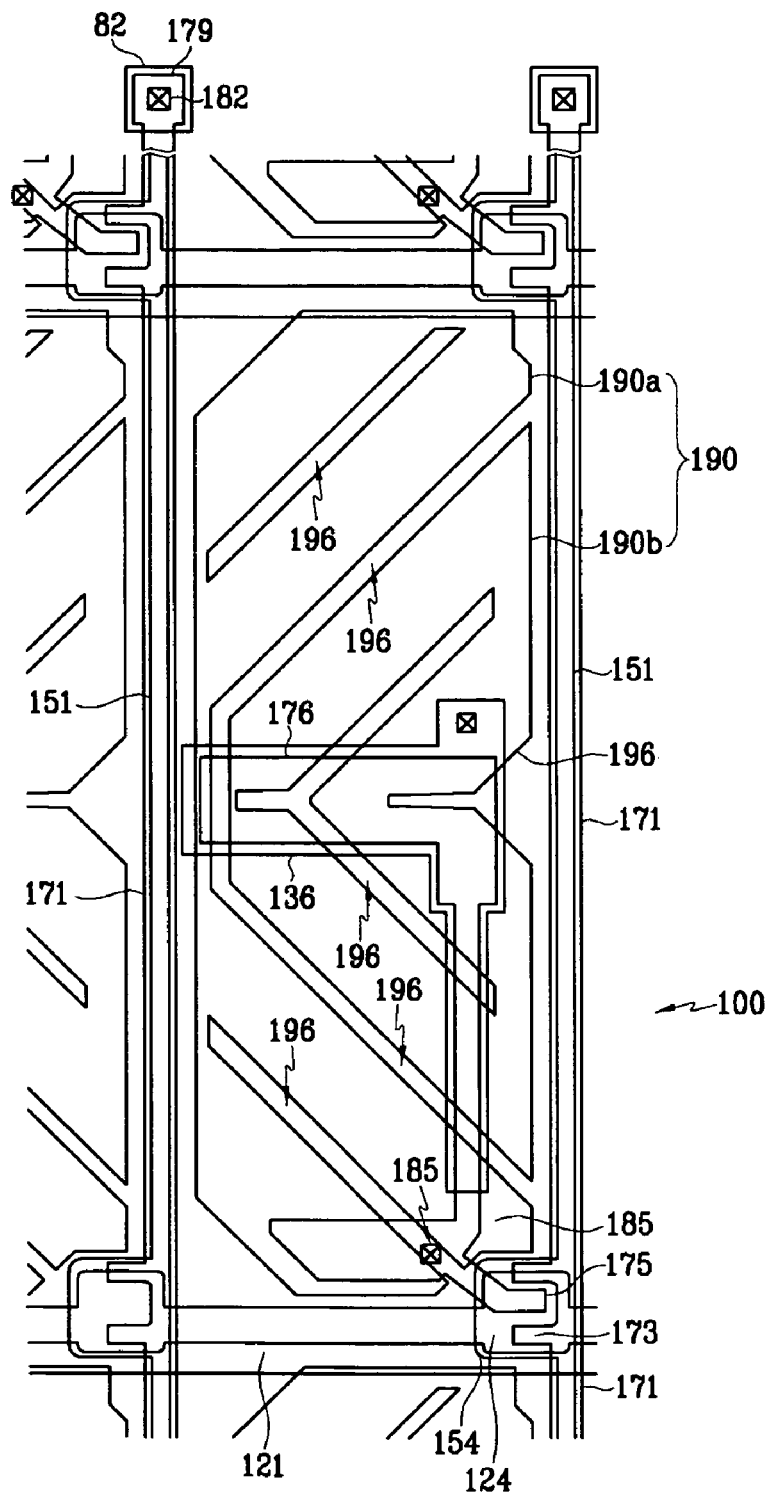
FIG. 9 shows a layout of an active matrix TFT substrate according to another embodiment of the invention.
Figure 10:
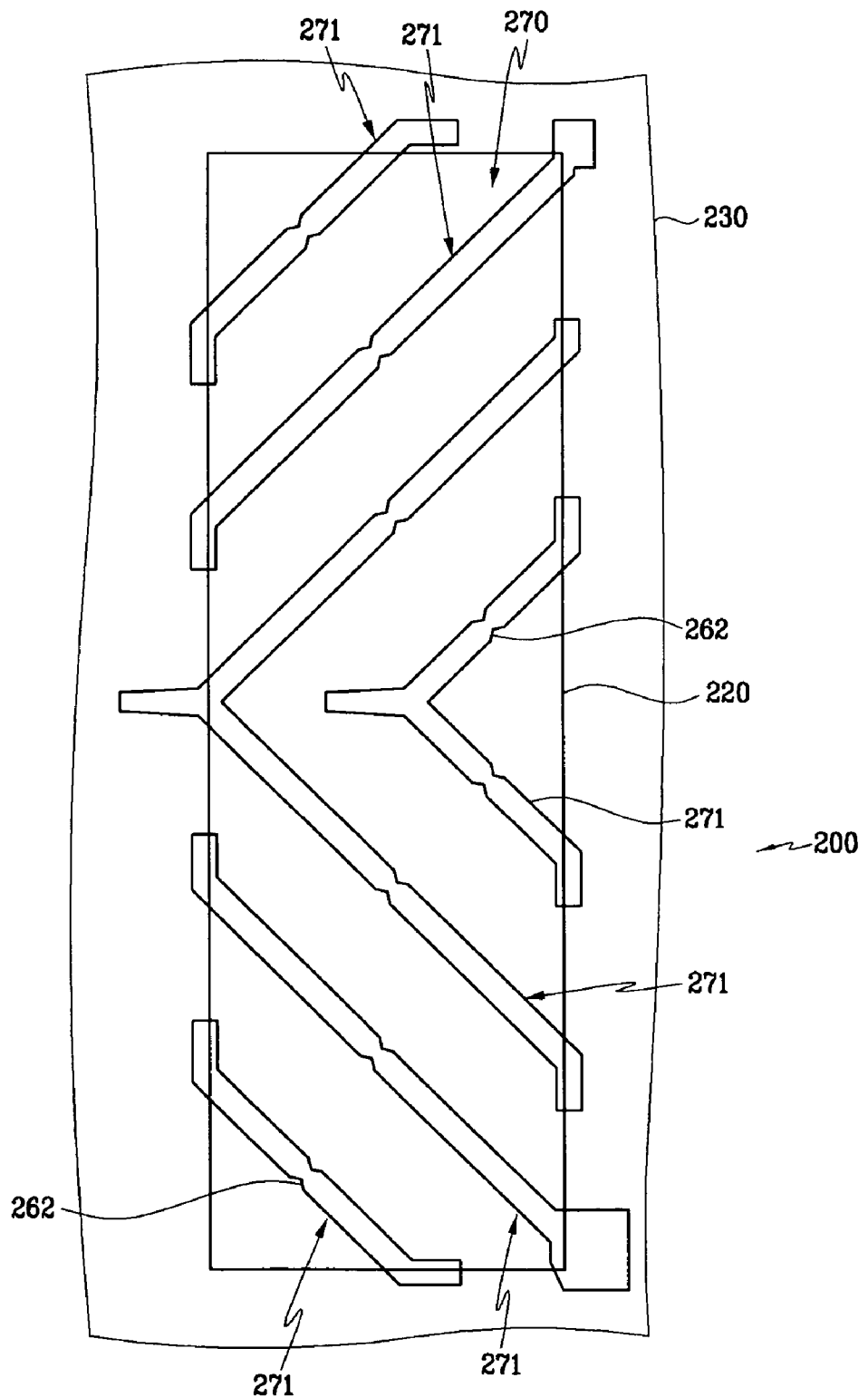
FIG. 10 shows a layout of a patterned substrate matched to the active matrix TFT substrate of FIG. 9.
Figure 11:
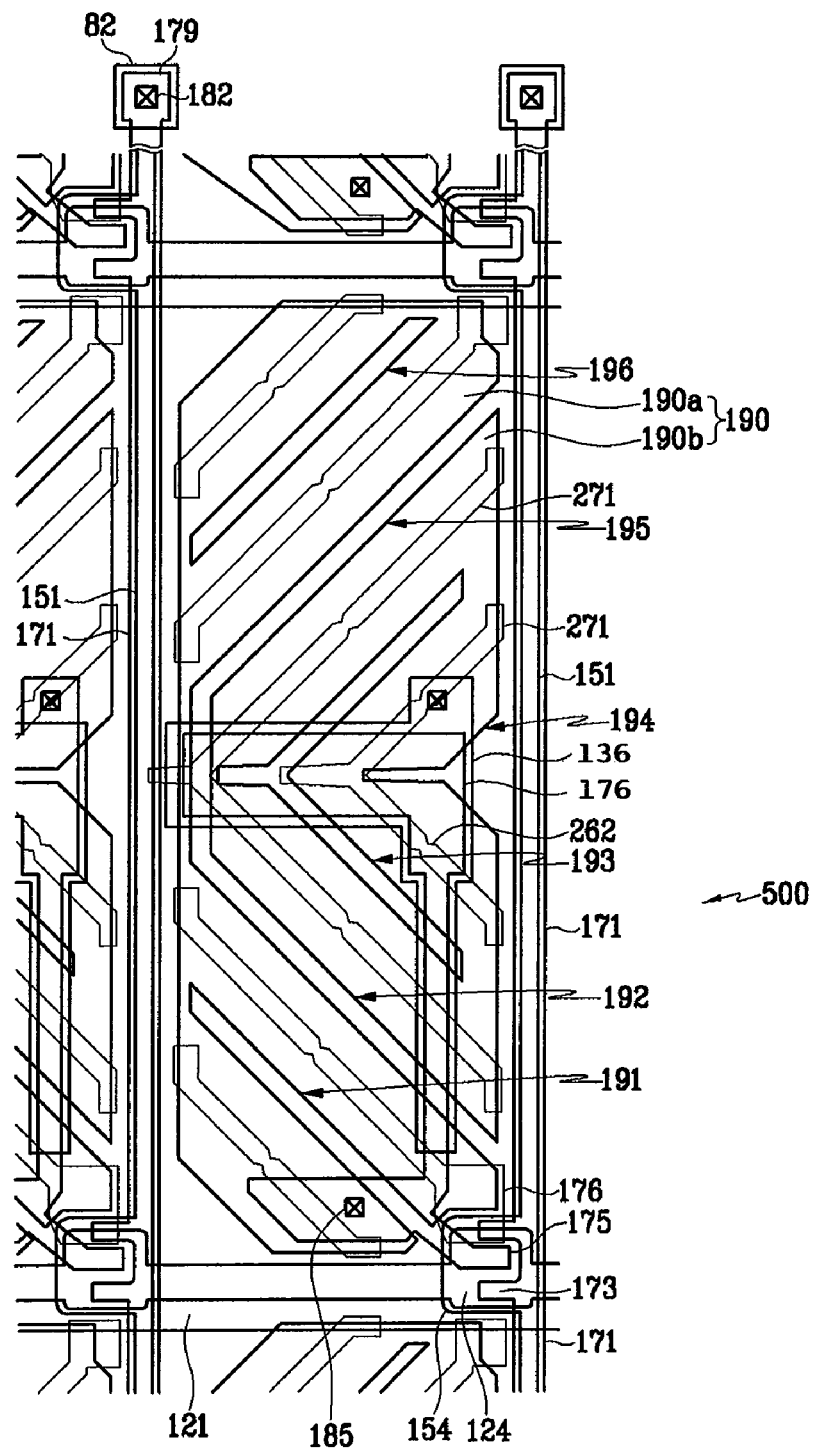
FIG. 11 shows a layout of an LCD panel, in which the active matrix TFT substrate of FIG. 9 and the patterned substrate of FIG. 10 are overlapped.

FIGS. 9, 10, and 11 illustrate an LCD panel 500 in accordance with another embodiment of the invention. FIG. 9 is the layout of active matrix TFT substrate 100, FIG. 10 is the layout of patterned substrate 200, and FIG. 11 is the layout of LCD panel 500. LCD panel 500 of FIG. 11 is basically the same as LCD panel 500 of FIGS. 3 and 4, except with respect to the layout of domains and apertures 196 of pixel electrode 190 and common electrode 270. Therefore, detailed explanation on the common structure will be omitted. LCD panel 500 of FIG. 11 has more apertures 196 and domains than LCD panel 500 of FIGS. 3 and 4. The increased number of apertures 196 and domains can prevent color shifts in viewing angle while effectively controlling liquid crystals in a relatively large size pixel area.

As described above, according to the present invention, in case of using gate insulator 140 as an interposing dielectric layer of a coupling capacitor, it can be possible to obtain sufficient coupling capacitance with a relatively small overlapping area of opposing electrodes, so as to minimize the reduction of transmittance due to overlapping area of opposed electrodes and simultaneously to prevent color shifts in viewing angle.

Although the illustrative embodiments have been described herein with reference to the accompanying drawings, it is to be understood that the present invention is not limited to those specific embodiments, and that various changes and modifications may be affected therein by one of ordinary skill in the related art without departing from the spirit and scope of the present invention. All such changes and modifications are intended to be included within the scope of the invention as defined in the appended claims.

What is claimed is:

1. An active matrix substrate comprising:
   a transistor, wherein the transistor comprises a gate line, a semiconductor layer, an insulating layer between the gate line and the semiconductor layer, a source electrode, and a drain electrode;
   a pixel electrode comprising a first sub-pixel electrode and a second sub-pixel electrode;
   an auxiliary coupling electrode connected to the second sub-pixel electrode through a first contact hole; and
   a coupling electrode connected to the drain electrode of the transistor and the first sub-pixel electrode through a second contact hole,
   wherein the auxiliary coupling electrode and the coupling electrode overlap each other such that the second sub-pixel electrode is capacitively coupled to the first sub-pixel electrode and the auxiliary coupling electrode and the coupling electrode form a capacitor.

2. The active matrix substrate of claim 1 further comprising a protective insulating layer between the coupling electrode and the pixel electrode.

3. The active matrix substrate of claim 2, wherein the protective insulating layer comprises silicon nitride.

4. The active matrix substrate of claim 2, wherein the protective insulating layer comprises a color filter layer.

5. The active matrix substrate of claim 2, wherein the protective insulating layer comprises a first protective layer and a second protective layer.

6. The active matrix substrate of claim 5, wherein the first protective layer comprises silicon nitride, and the second protective layer comprises a polymer.

7. The active matrix substrate of claim 6, wherein the second protective layer is thicker than the first protective layer.

8. The active matrix substrate of claim 1, wherein the semiconductor layer of the transistor extends such that a portion of the semiconductor layer has the same boundary as the coupling electrode.

9. The active matrix substrate of claim 1, wherein the auxiliary coupling electrode is made of the same layer as the gate line and the coupling electrode is made of the same layer as the drain electrode.

10. A liquid crystal display comprising;
    an active matrix substrate;
    a patterned substrate disposed opposite to the active matrix substrate; and
    a liquid crystal layer interposed between the active matrix substrate and the patterned substrate,
    wherein the active matrix substrate comprises:
    a transistor, wherein the transistor comprises a gate line, a semiconductor layer, an insulating layer between the gate line and the semiconductor layer, a source electrode, and a drain electrode;
    a pixel electrode comprising a first sub-pixel electrode and a second sub-pixel electrode;
    an auxiliary coupling electrode connected to the second sub-pixel electrode through a first contact hole; and
    a coupling electrode connected to the drain electrode of the transistor and the first sub-pixel electrode through a second contact hole,
    wherein the auxiliary coupling electrode overlaps and is coupled to the coupling electrode such that the second sub-pixel electrode is capacitively coupled to the first sub-pixel electrode and the auxiliary coupling electrode and the coupling electrode form a capacitor.

11. The liquid crystal display of claim 10 further comprising a protective insulating layer between the coupling electrode and the pixel electrode.

12. The liquid crystal display of claim 11, wherein the protective insulating layer comprises silicon nitride.

13. The liquid crystal display of claim 11, wherein the protective insulating layer comprises a color filter layer.

14. The liquid crystal display of claim 11, wherein the protective insulating layer comprises a first protective layer and a second protective layer.

15. The liquid crystal display of claim 14, wherein the first protective layer comprises silicon nitride, and the second protective layer comprises a polymer.

16. The liquid crystal display of claim 15, wherein the second protective layer is thicker than the first protective layer.

17. The liquid crystal display of claim 10, wherein the semiconductor layer extends such that a portion of the semiconductor layer of the transistor has the same boundary as the coupling electrode.

18. The liquid crystal display of claim 10, wherein the patterned substrate has an aperture that divides the liquid crystal layer into a plurality of domains.

19. The liquid crystal display of claim 18, wherein the auxiliary coupling electrode is formed along a portion of the aperture of the patterned substrate.

20. The liquid crystal display of claim 18, wherein the coupling electrode is formed along a portion of the aperture of the patterned substrate.

21. The active matrix substrate of claim 10, wherein the auxiliary coupling electrode is made of the same layer as the gate line and the coupling electrode is made of the same layer as the drain electrode.

* * * * *